United States Patent
Hauck et al.

(10) Patent No.: US 6,528,228 B2
(45) Date of Patent: *Mar. 4, 2003

(54) CHEMICAL RESISTANT UNDERLAYER FOR POSITIVE-WORKING PRINTING PLATES

(75) Inventors: Celin-Savariar Hauck, Badenhausen (DE); Gerhard Hauck, Badenhausen (DE)

(73) Assignee: Kodak Polychrome Graphics, LLC, Norwalk, CT (US)

( * ) Notice: Subject to any disclaimer, the term of this patent is extended or adjusted under 35 U.S.C. 154(b) by 70 days.

This patent is subject to a terminal disclaimer.

(21) Appl. No.: 09/729,765

(22) Filed: Dec. 5, 2000

(65) Prior Publication Data

US 2001/0044065 A1 Nov. 22, 2001

Related U.S. Application Data

(60) Provisional application No. 60/171,554, filed on Dec. 22, 1999.

(51) Int. Cl.[7] .............................................. G03F 7/023
(52) U.S. Cl. ..................... 430/166; 430/271.1; 430/302
(58) Field of Search ................................ 430/166, 302, 430/271.1

(56) References Cited

U.S. PATENT DOCUMENTS

| | | | | |
|---|---|---|---|---|
| 6,004,728 A | * | 12/1999 | Deroover et al. | 430/302 |
| 6,106,996 A | * | 8/2000 | Van Damme et al. | 430/271.1 |
| 6,294,311 B1 | * | 9/2001 | Shimazu et al. | 430/14 |

FOREIGN PATENT DOCUMENTS

| | | |
|---|---|---|
| EP | 0503602 | 9/1992 |
| EP | 0589309 | 3/1994 |
| EP | 0708730 | 6/1997 |
| EP | 1074887 | 2/2001 |
| GB | 1494043 | 12/1977 |
| GB | 2124399 | 2/1984 |
| GB | 2167876 | 6/1986 |
| JP | 09222737 | 8/1997 |
| JP | 09311437 | 12/1997 |
| JP | 09311442 | 12/1997 |
| JP | 09311454 | 12/1997 |
| JP | 09319077 | 12/1997 |

OTHER PUBLICATIONS

European Search Report for Application No. 00128103.9 (corresponding EP application) dated Mar. 22, 2001.

* cited by examiner

Primary Examiner—John S. Chu
(74) Attorney, Agent, or Firm—RatnerPrestia

(57) ABSTRACT

Multilayer photoimageable elements, useful for forming lithographic printing members, are disclosed. The elements comprise a support, a top layer, and a chemical resistant underlayer. The underlayer is resistant to aggressive washes, such as a UV wash. In one embodiment, the underlayer comprises a copolymer of N-substituted maleimide, methacrylamide, and methacrylic acid. A process for preparing a lithographic printing member is also disclosed.

25 Claims, No Drawings

CHEMICAL RESISTANT UNDERLAYER FOR POSITIVE-WORKING PRINTING PLATES

CROSS-REFERENCE TO RELATED APPLICATIONS

This application claims priority on U.S. Provisional Patent Application Ser. No. 60/171,554, filed on Dec. 22, 1999, incorporated herein by reference.

FIELD OF THE INVENTION

The invention relates to light-sensitive imageable elements useful in lithographic printing. More particularly, this invention relates multilayer photoimageable elements, useful for forming lithographic printing members, that comprises a chemical resistant underlayer.

BACKGROUND OF THE INVENTION

The art of lithographic printing is based on the immiscibility of oil and water. Ink receptive areas are generated on the surface of a hydrophilic surface. When the surface is moistened with water and then ink is applied, the hydrophilic background areas retain the water and repel the ink and the ink receptive areas accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Lithographic printing plates typically comprise a radiation-sensitive coating applied to a support. If after exposure to radiation, the exposed portions of the coating become soluble and are removed in the developing process, the plate is called as a positive-working printing plate. Conversely, if exposed portion of the plate become insoluble in the developer and the unexposed portions are removed by the developing process, the plate is called a negative-working plate. In each instance, the portions of the radiation-sensitive layer (i.e., the image areas) that remain are ink-receptive.

Nagashima, GB 2,124,399, discloses a printing plate comprising one or more light-sensitive layer or layers positioned on a support. The layer or layers comprise an o-diazonaphthoquinone compound and an alkali soluble resin, in which the concentration of the o-diazonaphthoquinone compound decreases in the direction of the support.

In use, a lithographic printing member is often subjected to aggressive blanket washes, such as a "UV wash" to remove ultraviolet curable inks. The areas of the radiation-sensitive coating that remain after development must resist these aggressive blanket washes. Thus, a need exists for improved imageable elements, useful as lithographic printing members, that are robust and are resistance to aggressive washes.

SUMMARY OF THE INVENTION

The invention is a multilayer photoimageable element that comprises a chemical resistant underlayer. The element comprises:

a) a substrate, the substrate comprising a hydrophilic surface;

b) an underlayer over the hydrophilic surface; and c) a top layer over the underlayer:

wherein:

the top layer is ink receptive;

the underlayer is soluble in aqueous alkaline developer;

the top layer comprises a material that comprises a o-diazonaphthoquinone moiety;

the underlayer is essentially free of material that comprises the o-diazonaphthoquinone moiety; and the underlayer has a one-minute soak loss in 80 wt % diacetone alcohol/20 wt % water of less than 20 wt %.

In another embodiment, the invention is an exposed and developed element, which can be used as a lithographic printing member. In another embodiment, the invention is a process for forming the lithographic printing member. In still another embodiment, the invention is a method of printing using the lithographic printing member.

DETAILED DESCRIPTION OF THE INVENTION

The multilayer imageable element (sometimes referred to as a printing plate precursor) comprises a hydrophilic substrate, typically comprising an aluminum or polyester support; a chemically resistant underlayer; and an ink-receptive top layer. Although other layers, such as radiation absorbing layers may be present, typically no other layers are present. The element has increased speed and is very robust, developing well in a broad spectrum of positive and negative developers.

Hydrophilic Substrate

The hydrophilic substrate, i.e., the substrate comprising at least one hydrophilic surface, comprises a support, which may be any material conventionally used to prepare lithographic printing plates. The support is preferably strong, stable and flexible. It should resist dimensional change under conditions of use so that color records will register in a full-color image. Typically, it can be any self-supporting material, including polymeric films, ceramics, metals, or stiff papers, or a lamination of any of these materials. Paper supports are typically "saturated" with polymerics to impart water resistance, dimensional stability and strength.

Metal supports include aluminum, zinc, titanium, and alloys thereof. A preferred metal support is an aluminum sheet. The surface of the aluminum sheet may be treated by techniques known in the art, including physical graining, electrochemical graining, chemical graining, and anodizing, and then conditioned by chemical means, for example by treatment with water, a solution of phosphate or silicate salt, or a polycarboxylic acid to produce the hydrophilic surface.

If the surface is roughened, the average roughness Ra is preferably in the range 0.1 μm to 0.8 μm. Roughened substrates in which the surface has a surface roughness of 0.1 μm to 2 μm are disclosed in Bhambra, WO97/19819 (PCT/GB96/02883); Bhambra, WO98/52769 (PCT/GB98/01500); and Bhambra, WO98/52768 (PCT/GB/98/01496). In these substrates the support is coated with a hydrophilic layer that comprises a mixture of two particulate materials, preferably alumina and titanium dioxide. The mean particle size of the alumina particles is preferably in the range of 1 μm to 5 μm; the mean particle size of the titanium dioxide particles is preferably in the range of 0.1 μm to 0.5 μm.

Useful polymeric films include polyester films (such as Mylar® polyethylene terephthalate film sold by E.I. du Pont de Nemours Co., Wilmington, Del., and polyethylene naphthanate). A preferred polymeric film is polyethylene terephthalate.

The substrate may consist only of the support, or it may additionally comprise one or more optional subbing and/or adhesion layers. Typically, polymeric films contain a subcoating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion promoting materials, such as alkoxysilanes, aminopropyltriethoxysilane, glycidoxypropyltriethoxysilane and epoxy functional polymers, as well as conventional subbing materials used on polyester bases in photographic films.

The back side of the substrate (i.e., the side opposite the underlayer and top layer) may be coated with an antistatic agent and/or a slipping layer or matte layer to improve handling and "feel" of the imageable element.

The support should be of sufficient thickness to sustain the wear from printing and be thin enough to wrap around a printing form. Polyethylene terephthalate or polyethylene naphthanate, typically has a thickness of from about 100 to about 310 μm, preferably about 175 μm. Aluminum sheet typically has a thickness of from about 100 to about 600 μm.

Underlayer

The underlayer, or first layer, is over the hydrophilic surface of the hydrophilic substrate. After imaging, it is removed by the developer to expose the underlying hydrophilic surface of the substrate. It is preferably soluble in the aqueous alkaline developer to prevent sludging of the developer. Preferably it is soluble in a wholly aqueous developer, i.e., one that does not include added organic solvents.

The underlayer has one-minute soak loss in 80 wt % diacetone alcohol/20 wt % water of less than about 20 wt %, preferably less than 10 wt %, and more preferably less than about 5 wt %. In favorable cases a soak loss of less than about 2 wt % in 80 wt % diacetone alcohol/20 wt % water may be obtained.

The resistance of an underlayer to aggressive washes, such as a UV wash, can be tested by a one-minute soak loss in 80 wt % diacetone alcohol/20 wt % water. As described in the Examples, one-minute soak loss is measured by coating a layer of the polymeric material on a substrate, typically at a coating weight of about 1.5 g/m$^2$, soaking the coated substrate in the appropriate solvent for one minute at room temperature, drying the coated substrate, and measuring the weight loss as a percent of the total weight of polymeric material present on the substrate.

The underlayer comprises a first polymeric material. The first polymeric material is soluble in an aqueous alkaline developer. In addition, the first polymeric material should be insoluble in the solvent used to coat the top layer so that the top layer can be coated over the underlayer without dissolving the underlayer. It is preferable that the underlayer be essentially free of materials containing the diazonaphthoquinone moiety, such as might be introduced into the underlayer during coating if the underlayer is soluble in the solvent used to coat the top layer.

A group of preferred first polymeric materials are copolymers that at least one functional group selected from the group consisting of carboxylic acid, N-substituted cyclic imide, and amide, preferably two of these functional groups, and more preferably all three functional groups. Preferably these polymeric materials comprise N-substituted maleimides, especially N-phenylmaleimide; methacrylamides, especially methacylamide; and acrylic and/or methacrylic acid, especially methacrylic acid. The preferred polymeric materials of this type are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some of all of the methacrylamide. Other aqueous alkaline soluble monomers, such as acrylic acid, may be used in place of some or all of the methacrylic acid.

These polymeric materials are soluble aqueous alkaline developers. In addition they are soluble in methyl lactate/methanol/dioxolane (15:42.5:42.5 wt %) mixture, which can be used as the coating solvent for the underlayer. However, they are poorly soluble in solvents such as acetone, which can be used as solvents to coat the top layer on top of the underlayer without dissolving the underlayer. An underlayer formed from these materials has a one-minute soak loss in 80 wt % diacetone alcohol/20 wt % water of less than 5 wt %.

Top Layer

The top layer, or second layer, protects the underlying underlayer, which is soluble in aqueous alkaline developer, from the aqueous alkaline developer. The top layer of comprises a positive working photoimagable composition. The photoimageable composition comprises a phenolic resin and a material that comprises a o-diazonaphthoquinone (naphthoquinonediazide) moiety, i.e., a o-diazonaphthoquinone compound and/or a phenolic resin derivitized with a o-diazonaphthoquinone moiety.

The top layer comprises a polymer that contains phenolic hydroxyl groups, i.e., a phenolic resin. Novolac resins, resol resins, and polyvinyl phenol resins, which contain phenolic hydroxyl groups, are preferred phenolic resins. Novolac resins are more preferred.

Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-cresol, mixtures of in-cresol and p-cresol, or phenol with formaldehyde using conditions well known to those skilled in the art.

Other useful phenolic resins include polyvinyl compounds having phenolic hydroxyl groups. Such compounds include, for example, polyhydroxystyrenes and copolymers containing recurring units of a hydroxystyrene, and polymers and copolymers containing recurring units of substituted hydroxystyrenes.

The photoimageable composition also comprises a material that comprises a o-diazonaphthoquinone (diazonaphthoquinone) moiety. Photoimageable compositions comprising materials that comprises a diazonaphthoquinone moiety are described in numerous patent and publications, such as Schmidt, U.S. Pat. Nos. 3,046,110, 3,046,111, 3,046,115, 3,046,118, and 3,046,120; Süs, U.S.

Pat. Nos. 3,046,119, and 3,046,122; and Rauner, U.S. Pat. No. 3,647,443; as well as in Chapter 5 of *Photoreactive Polymers: the Science and Technology of Resists*, A. Reiser, Wiley, New York, 1989, pp. 178–225. While not being bound by any theory or explanation, it is believed that image discrimination in these systems is based on a kinetic effect. The exposed regions dissolve more rapidly in the basic developer than the unexposed regions. Development is carried for a long enough time to dissolve the exposed regions in the developer, but not long enough to dissolve the unexposed regions. Hence the exposed regions are described as being "soluble" in the developer and the unexposed regions as being "insoluble" in the developer.

The compound that contains a o-diazonaphthoquinone moiety (i.e., quinonediazides) may be a compound in which the o-diazonaphthoquinone moiety is attached to a ballasting moiety that has a molecular weight of less than about 5000. Typically these compounds are prepared by the reaction of a 1,2-naphthoquinone diazide having a halogenosulfonyl group, typically a sulfonylchloride group, at the 4- or 5-position with a mono- or poly-hydroxyphenyl compound, such as a mono- or poly-hydroxy benzophenone. Preferred reactive compounds are the sulfonyl chloride or esters; the sulfonyl chlorides are most preferred. These compounds are discussed, for example, in Chapter 5 of *Photoreactive Polymers: the Science and Technology of Resists*, A. Reiser, Wiley, New York, 1989, pp. 178–225.

Useful diazonaphthoquinone compounds include, but are not limited to: 2,4-bis(2-diazo-1,2-dihydro-1-oxo-5-naphthalene-sulfonyloxy)benzophenone; 2-di-azo-1,2-dihydro-1-oxo-5-naphthalenesulfonyloxy-2,2-bishydroxyphenylpropane monoester; the hexahydroxybenzophenone hexaester of 2-diazo-1,2-dihydro-1-oxo-5-naphthalenesulfonic acid; 2,2'-bis(2-diazo-1,2-di-hydro-1-oxo-5-naphthalenesulfonyloxy)biphenyl; 2,2',4,4'-tetrakis(2-diazo-1,2-dihydro-1-oxo-5-naphthalenesulfonyloxy)-biphenyl; 2,3,4-tris(2-diazo-1,2-dihydro-1-oxo-5-naphthalene-sulfonyloxy)benzophenone; 2,4-bis(2-diazo-1,2-dihydro-1-oxo-4-naphthalenesulfonyloxy)benzophenone; 2-diazo-1,2-dihydro-1-oxo-4-naphthalenesulfonyloxy-2,2-bishydroxyphenylpropane mono-ester; the hexahydroxybenzophenone hexaester of 2-diazo-1,2-dihydro-1-oxo-4-naphthalenesulfonic acid; 2,2'-bis(2-diazo-1,2-dihydro-1-oxo-4-naphthalenesulfonyloxy)biphenyl; 2,2',4,4'-tetrakis(2-diazo-1,2-dihydro-1-oxo-4-naphthalenesulfonyloxy)biphenyl; 2,3,4-tris(2-diazo-1,2-dihydro-1-oxo-4-naphthalenesulfonyloxy)benzophenone; and others known in the art, for example, those described in Mizutani, U.S. Pat No. 5,143,816.

The phenolic resin may be derivitized with a o-diazonaphthoquinone moiety. Polymeric diazonaphthoquinone compounds include derivitized resins formed by the reaction of a reactive derivative that contains diazonaphthoquinone moiety and a polymeric material that contains a suitable reactive group, such as a hydroxyl or amino group. Suitable polymeric materials for forming these derivitized resins include the novolac resins, resole resins, polyvinyl phenols, acrylate and methacrylate copolymers of hydroxy-containing monomers such as vinyl phenol and 2-hydroxyethyl methacrylate, polyvinyl alcohol, etc. Representative reactive derivatives include sulfonic and carboxylic acid, ester or amide derivatives of the diazonaphthoquinone moiety. Derivitization of phenolic resins with compounds that contain the diazonaphthoquinone moiety is well known in the art and is described, for example, in West, U.S. Pat. Nos. 5,705,308, and 5,705,322. An example of a resin derivitized with a compound that comprises a diazonaphthoquinone moiety is P-3000, naphthoquinone diazide of a pyrogallol/acetone resin (available from PCAS, France).

The photoimageable composition present in the top layer comprises a material that comprises a o-diazonaphthoquinone moiety, i.e., a o-diazonaphthoquinone compound and/or a phenolic resin derivitized with a o-diazonaphthoquinone moiety. The amount of the diazonaphthoquinone moiety present in the layer, which may be present in a diazonaphthoquinone compound and/or in a resin derivitized with a diazonaphthoquinone compound, is typically at least about 1 wt % and more typically 3 to 50 wt %.

The top layer may also comprise dye to aid in the visual inspection of the exposed and/or developed element. Print-out dyes to distinguish the exposed regions from the unexposed regions during processing. A compound that generates acid on exposure to actinic radiation, such a halogen-containing triazine, may also be present to produce a print-out image. Contrast dyes distinguish the unimaged regions from the imaged regions in the developed plate.

Preparation of the Imageable Element

The imageable element may be prepared by sequentially applying the underlayer over the hydrophilic surface of the hydrophilic substrate, and then applying the top layer over the underlayer using conventional coating or lamination methods. However, it is important to avoid intermixing the underlayer and top layer. During coating, care must be taken to prevent mixing of these layers. To maintain the robustness of the element, the underlayer is preferably essentially free of materials containing the diazonaphthoquinone moiety, such as are present in the top layer.

The underlayer, or first layer, may be applied over the hydrophilic substrate by any conventional method. Typically the ingredients are dispersed or dissolved in a suitable coating solvent, and the resulting mixtures coated by conventional methods, such as spin coating, bar coating, gravure coating, or roller coating. The top layer, or second layer, may be applied over the underlayer, typically to the surface of the underlayer by any conventional method, such as those listed above. The term "solvent" includes mixtures of solvents, especially mixtures of organic solvents.

Selection of the solvents used to coat the underlayer and to coat the top layer will depend on the nature of the ingredients present in the layers. To prevent the underlayer from dissolving and mixing with the top layer when the top layer is coated over the underlayer, the top layer should be coated from a solvent in which the underlayer is essentially insoluble. Thus, the coating solvent for the top layer should be a solvent in which the polymeric material in the top layer is sufficiently soluble that the top layer can be formed and in which the polymeric material in the underlayer is essentially insoluble. Typically the polymeric material in the underlayer will be soluble in more polar solvents and insoluble in less polar solvents so that the solvent used to coat the underlayer is more polar than the solvent used to coat the top layer. Consequently, the top layer can typically be coated from a conventional organic solvent such as toluene or 2-butanone. An intermediate drying step, i.e., drying the underlayer to remove coating solvent before coating the top layer over it, may also be used to prevent mixing of the layers.

The top layer may be coated as an aqueous dispersion to avoid dissolving the underlayer during the coating process. Alternatively, the underlayer, the top layer or both layers may be applied by conventional extrusion coating methods from a melt mixture of layer components. Typically, such a melt mixture contains no volatile organic solvents.

Imaging

Imaging is carried out by methods well known to those skilled in the art. The element is imagewise exposed to actinic radiation from a source of light that is absorbed by the photoreactive component or components of the top layer, such as a carbon arc lamp, a mercury lamp, a xenon lamp, a tungsten lamp, a metal halide lamp, or a laser emitting at the appropriate wavelength. o-Diazonaphthoquinone compounds substituted in the 5-position typically absorb at 350 and 400 nm. Diazonaphthoquinone compounds substituted in the 4-position typically absorb at 310 and 390 nm. Imagewise exposure is typically carried out through a photomask, but direct digital exposure with a laser emitting at the appropriate wavelength is also possible.

The photoimageable element is "positive working," in that the first and top layers are removed in the exposed regions to expose the underlying hydrophilic surface of the hydrophilic substrate. Thus, the exposed regions become the non-ink accepting regions.

Imaging of the imageable element produces an imaged element, which comprise a latent image of imaged and unimaged regions. Developing the exposed element to form a developed element, converts the latent image to an image by removing the exposed regions of the top layer and the underlayer, and exposing the hydrophilic surface of the underlying substrate. The element is positive working, in that the underlayer and top layers are removed in the exposed regions. The exposed regions become the non-ink accepting regions.

The exposed element is developed in an appropriate developer. The developer may be any liquid or solution that can penetrate and dissolve both the exposed regions of the top layer and the underlying regions of the underlayer without substantially affecting the complimentary unexposed regions.

Useful developers are the aqueous solutions having a pH of about 7 or above. Preferred developers are those that have a pH between about 8 and about 13.5, typically at least about 11, preferably at least about 12. Wholly aqueous developers, i.e., those that do not comprise an added organic solvent, are preferred. Useful aqueous alkaline developers include commercially available developers, such as PC3000, PC955, and PC9000, aqueous alkaline developers each available from Kodak Polychrome Graphics LLC.

Typically the developer is applied to the imaged element by rubbing or wiping the top layer with an applicator containing the developer. Alternatively, the imaged element may be brushed with the developer or the developer may be applied to the element by spraying the top layer with sufficient force to remove the exposed regions. In either instance, a developed element is produced.

The developed element, typically a lithographic printing member or printing plate, comprises (1) regions in which the underlayer and top layer have been removed revealing the underlying surface of the hydrophilic substrate, and (2) complimentary regions in which the under layer and top layer have not been removed. The regions in which both the underlayer and top layer have not been removed are ink receptive and correspond to the regions that were not exposed during imaging.

If desired, a post-development baking step can be used to increase the run length of the printing member. Baking can be carried out, for example, at about 220° C. to about 240° C. for about 7 to 10 minutes.

The advantageous properties of the invention can be observed by reference to the following examples that illustrate, but do not limit, the invention.

EXAMPLES

| | Glossary |
|---|---|
| ADS-830A | Infrared absorbing dye ($\lambda_{max}$ = 830 nm) (American Dye Source, Montreal, Canada) |
| Copolymer 1 | Copolymer of N-phenylmaleimide, methacrylamide, and methacrylic acid (45:35:20 mol %) |
| Copolymer 2 | Copolymer of N-phenylmaleimide, methacrylamide, and methacrylic acid (40:35:25 mol %) |
| DOWANOL ® PM | Propylene glycol methyl ether |
| EC2117 | Infrared absorbing dye ($\lambda_{max}$ = 830 nm) (FEW, Wolfen, Germany) |
| NQD | Naphthoquinonediazide sulfonic acid ester of p-cresol novolac resin |
| PD140A | Cresol/formaldehyde novolac resin (75:25 m-cresol/p-cresol) (Borden Chemical, Columbus, Ohio, U.S.A.) |

Triazine B 2,4-Bis(trichloromethyl)-6-(4-methoxy-1-naphthyl)-1,3,5-triazine (PCAS, France)

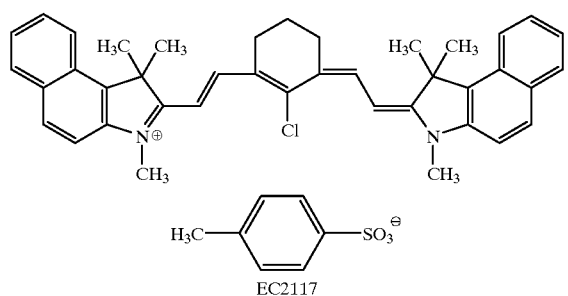

EC2117

Comparative Example

A positive-working printing plate was prepared. A composition (100 g) containing 25 wt % NQD, 72.5 wt % PD140A, 2 wt % ethyl violet, and 0.5% triazine B in 100 mL of ethylene glycol/2-butanone (90:10 wt %) was coated onto a substrate at a coating weight of 2.0 g/m$^2$. The substrate was an aluminum sheet that had been electrochemically grained to Ra 0.59, anodized, and coated with polyvinyl phosphonic acid.

The plate was exposed through a URGA step wedge in an exposure frame. The exposed plate was developed in Goldstar™ developer (positive developer, Kodak Polychrome Graphics, Norwalk, Conn.) for 20 sec at room temperature. The gray scale had 2 steps. The microlines were 12 microns. The developed image was attacked by diacetone alcohol in 10 sec. It was attacked by the developer in about three minutes.

Example 1

This example describes the preparation of Copolymer 1. Methyl glycol (800 mL) was placed in a 1 L round-bottomed flask equipped with a stirrer, thermometer, nitrogen inlet and reflux condenser. Methacrylic acid (27.1 g), N-phenylmaleimide (183.7 g), and methacrylamide (62.5 g) added and dissolved with stirring. 2,2-Azobisisobutyronitrile (AIBN) (3.4 g) was added and the reaction mixture heated at 60° C. with stirring for 22 hr. Then methanol was added, and the precipitated copolymer filtered, washed twice with methanol, and dried in the oven at 40° C. for 2 days.

Other copolymers of this type can be prepared by this procedure, For example, reaction of methacrylic acid (27.1 g), N-phenylmaleimide (183.7 g), methacrylamide (62.5 g), and AIBN (3.4 g) to forms a copolymer that contains N-phenylmaleimide, methacrylamide, and methacrylic acid in a 50:35:15 mol % ratio.

If the polymerization is carried out in 1,3-dioxolane, in some cases reprecipitation can be avoided. The monomers are soluble 1,3-dioxolane, but the polymer is insoluble and precipitates during the reaction.

Example 2

This example describes the preparation of Copolymer 2. Methyl glycol (1 L) was placed in a round-bottomed flask equipped with a stirrer, thermometer, nitrogen inlet and reflux condenser. Methacrylic acid (55.74 g), N-phenylmaleimide (181.48 g), and methacrylamide (77.13 g) were added and dissolved with stirring. 2,2-Azobisisobutyronitrile (AIBN) (0.425 g) was added and the reaction mixture heated at 60° C. with stirring for about 24 hr. Then about 5 L of methanol was added, and the precipitated copolymer filtered, washed twice with methanol, and dried in the oven at 40° C. for 2 days.

Example 3

A positive-working printing plate was prepared. Copolymer 1 (5 g) and EC2117 (0.2 g) were dissolved in 45 g of DOWANOL® PM/methanol/dioxolane (15:45:40 wt %) mixture and coated onto the same substrate as used in the Comparative Example to give a coating weight of 1.0 g/m$^2$. The composition of the Comparative Example was overcoated onto this layer at a coating weight of 1.0 g/m$^2$.

The plate was exposed through a URGA step wedge and developed as described in the Comparative Example. The gray scale had 5 steps, indicating that the speed of the element is at least twice that of the element in the Comparative example. The microlines were 20/25 microns. The developed image was not attacked by diacetone alcohol after two minutes. It was attacked by developer in about two minutes.

Example 4

This example illustrates the solvent resistance of an underlayer of Copolymer 2. Copolymer 2 (5 g) and ADS-830A dye (0.9 g) were dissolved in a 100 g of a methanol/dioxolane/methyl lactate mixture (43:43:14 wt %). The mixture was spin coated onto a standard lithographic substrate at a coating weight of 1.5 g/m$^2$. The substrate was an aluminum sheet that had been electrochemically grained, anodized, and coated with polyvinyl phosphonic acid.

Solvent resistance of the underlayer was measured in terms of soak loss. Soak loss was measured by measuring the weight change of a 1 dm$^2$ plate before soaking and after soaking in 80 wt % diacetone alcohol/20 wt % water for a specific time and drying. Soak loss was calculated by dividing the weight loss by the total weight of the coating. The one-minute soak loss in the diacetone alcohol/water mixture was 0%.

Having described the invention, we now claim the following and their equivalents.

What is claimed is:

1. A photoimageable element comprising:
   a) a substrate, the substrate comprising a hydrophilic surface;
   b) an underlayer over the hydrophilic surface; and
   c) a top layer over the underlayer;
   wherein:
   the top layer is ink receptive;
   the underlayer is soluble in aqueous alkaline developer;
   the top layer comprises a material that comprises a o-diazonaphthoquinone moiety;
   the underlayer is essentially free of material that comprises the o-diazonaphtho-quinone moiety; and
   the underlayer has a one-minute soak loss in 80 wt % diacetone alcohol/20 wt % water of less than about 20 wt %.

2. The element of claim 1 in which no other layers are present.

3. The element of claim 1 in which the underlayer has a one-minute soak loss in 80 wt % diacetone alcohol/20 wt % water of less than about 10 wt %.

4. The element of claim 1 in which the underlayer has a one-minute soak loss in 80 wt % diacetone alcohol/20 wt % water of less than about 5 wt %.

5. The element of claim 4 in which the underlayer comprises a first polymeric material, the first polymeric material containing at least one functional group selected from the group consisting of carboxylic acid, N-substituted cyclic imide, and amide.

6. The element of claim 5 in which the first polymeric material contains the carboxylic acid, N-substituted cyclic imide, and amide functional groups.

7. The element of claim 6 in which the first polymeric material is a copolymer that comprises an N-substituted maleimide, methacrylamide, and methacrylic acid.

8. The element of claim 7 in which the first polymeric material comprises about 25 to about 75 mol % of N-phenylmaleimide; about 10 to about 50 mol % of methacrylamide; and about 5 mol % to about 30 mol % methacrylic acid.

9. The element of claim 8 in which the first polymeric material comprises about 35 to about 60 mol % of N-phenylmaleimide; about 15 to about 40 mol % of methacrylamide; and about 10 mol % to about 30 mol % methacrylic acid.

10. The element of claim 9 in which no other layers are present.

11. The element of claim 1 in which the top layer comprises a phenolic resin.

12. The element of claim 11 in which the phenolic resin is a novolac resin.

13. The element of claim 12 in which the first polymeric material comprises about 25 to about 75 mol % of N-phenylmaleimide; about 10 to about 50 mol % of methacrylamide; and about 5 mol % to about 30 mol % methacrylic acid.

14. The element of claim 13 in which the first polymeric material comprises about 35 to about 60 mol % of N-phenylmaleimide; about 15 to about 40 mol % of methacrylamide; and about 10 mol % to about 30 mol % methacrylic acid.

15. A photoimageable element comprising:
   a) a substrate, the substrate comprising a hydrophilic surface;
   b) an underlayer over the hydrophilic surface; and
   c) a top layer over the underlayer:
   wherein:
   the top layer is ink receptive;
   the underlayer is soluble in aqueous alkaline developer;

the top layer comprises a material that comprises a o-diazonaphthoquinone moiety;

the underlayer is essentially free of the material that comprises a o-diazonaphthoquinone moiety; and the underlayer comprises a first polymeric material that is a copolymer comprising an N-substituted maleimide, methacrylamide, and methacrylic acid.

16. The element of claim 15 in which the first polymeric material comprises about 25 to about 75 mol % of N-phenylmaleimide; about 10 to about 50 mol % of methacrylamide; and about 5 mol % to about 30 mol % methacrylic acid.

17. The element of claim 16 in which the first polymeric material comprises about 35 to about 60 mol % of N-phenylmaleimide; about 15 to about 40 mol % of methacrylamide; and about 10 mol % to about 30 mol % methacrylic acid.

18. The element of claim 17 in which no other layers are present.

19. The element of claim 15 in which the top layer comprises a phenolic resin.

20. The element of claim 19 in which the phenolic resin is a novolac resin.

21. A method for preparing a lithographic printing member, the method comprising the steps of:

imagewise exposing a photoimageable element and forming an exposed element comprising exposed and unexposed regions; and developing the exposed element with a developer and removing the exposed regions without substantially affecting the complementary unexposed regions;

in which the photoimageable element comprises:

a) a substrate, the substrate comprising a hydrophilic surface;

b) an underlayer over the hydrophilic surface; and c) a top layer over the underlayer;

wherein:

the top layer is ink receptive;

the underlayer is soluble in aqueous alkaline developer;

the top layer comprises a material that comprises a o-diazonaphthoquinone moiety;

the underlayer is essentially free of material that comprises the o-diazonaphthoquinOne moiety; and the underlayer has a one-minute soak loss in 80 wt % diacetone alcohol/20 wt % water of less than about 20 wt %.

22. The method of claim 21 in which:

the top layer comprises a phenolic resin; and the underlayer comprises a copolymer comprising an N-substituted maleimide, methacrylamide, and methacrylic acid.

23. The method of claim 22 in which the phenolic resin is a novolac resin; and the copolymer comprises about 35 to about 60 mol % of N-phenylmaleimide; about 15 to about 40 mol % of methacrylamide; and about 10 mol % to about 30 mol % methacrylic acid.

24. The element of claim 1 in which the underlayer has a coating weight of 1.0 $g/m^2$ to 1.5 $g/m^2$.

25. The element of claim 15 in which the underlayer has a coating weight of 1.0 $g/m^2$ to 1.5 $g/m^2$.

* * * * *